(12) United States Patent
Shigaki et al.

(10) Patent No.: US 8,508,513 B2
(45) Date of Patent: Aug. 13, 2013

(54) DISPLAY DEVICE

(75) Inventors: Takumi Shigaki, Mobara (JP); Toshio Miyazawa, Chiba (JP); Hideo Sato, Hitachi (JP); Masahiro Maki, Mobara (JP)

(73) Assignees: Hitachi Displays, Ltd., Chiba (JP); Panasonic Liquid Crystal Display Co., Ltd., Hyogo-Ken (JP)

( * ) Notice: Subject to any disclaimer, the term of this patent is extended or adjusted under 35 U.S.C. 154(b) by 1090 days.

(21) Appl. No.: 12/398,326

(22) Filed: Mar. 5, 2009

(65) Prior Publication Data

US 2009/0225063 A1    Sep. 10, 2009

(30) Foreign Application Priority Data

Mar. 5, 2008  (JP) ................... 2008-054732

(51) Int. Cl.
*G09G 5/00*    (2006.01)
(52) U.S. Cl.
USPC ............................................. 345/204; 345/90
(58) Field of Classification Search
USPC ................. 345/90, 92, 94, 98–100, 204, 212; 377/64
See application file for complete search history.

(56) References Cited

U.S. PATENT DOCUMENTS

2007/0262935 A1* 11/2007 Shin ................................. 345/84
2007/0279341 A1* 12/2007 Park ................................. 345/77

FOREIGN PATENT DOCUMENTS

JP    2007-156054    6/2007

* cited by examiner

*Primary Examiner* — Joseph Field
*Assistant Examiner* — Andrew Sasinowski
(74) *Attorney, Agent, or Firm* — Antonelli, Terry, Stout & Kraus, LLP.

(57) ABSTRACT

A display device which enhances time-wise likelihood for a leak current from a floating memory node by increasing the number of writings of a voltage to a floating memory node. A vertical driver includes: a shift register including basic circuits which output common electrode driving pulses based on a transfer; and a common electrode driver including common basic circuits which receive the common electrode driving pulses and the transfer clock. Each common basic circuit includes: a circuit A which fetches an AC signal based on the common electrode driving pulse; a circuit B which outputs, based on the AC signal, a first common voltage or a second common voltage which differs from the first common voltage in voltage level to the common electrodes corresponding to the AC signal; and a circuit C which holds a state of the circuit B based on the transfer clock.

8 Claims, 8 Drawing Sheets

DISPLAY DEVICE

CROSS-REFERENCE TO RELATED APPLICATIONS

The disclosure of Japanese Patent Application No. 2008-54732 filed on Mar. 5, 2008 including the specification, drawings and abstract is incorporated herein by reference in its entirety.

BACKGROUND OF THE INVENTION

1. Field of the Invention

The present invention relates to a display device, and more particularly to a technique which is effectively applicable to a display device having a common electrode driver circuit which drives common electrodes.

2. Description of the Related Art

For example, in an active-matrix-type liquid crystal display device which uses thin film transistors (TFT) as active elements, on a liquid-crystal-side surface of one substrate out of substrates which are arranged to face each other in an opposed manner with liquid crystal sandwiched therebetween, pixel regions each of which is surrounded by scanning signal lines which extend in the x direction and are arranged parallel to each other in the y direction and video signal lines which extend in the y direction and are arranged parallel to each other in the x direction are formed. The pixel region includes a pixel-use transistor (TFT) which is operated in response to the supply of a scanning signal from the scanning signal line.

The liquid crystal display device includes a vertical driver circuit which supplies a scanning signal to the respective scanning signal lines, and a horizontal driver circuit which supplies a video signal to the respective video signal lines, and these driver circuits respectively include a shift register circuit.

On the other hand, there has been also known a polysilicon-type liquid crystal display device in which a semiconductor layer of a thin film transistor which constitutes the above-mentioned active element is made of polycrystalline silicon (polysilicon). In such a polysilicon-type liquid crystal display device, the thin film transistor (for example, MOS transistor) which constitutes the vertical driver circuit and the horizontal driver circuit is also formed on the above-mentioned surface of one substrate in the same step as the thin film transistors which constitutes the active elements.

For example, Japanese Patent Laid-Open No. 2007-156054 (patent document 1) discloses a related art of the present invention. That is, patent document 1 discloses a liquid crystal display device which includes a single-channel (n-MOS) common electrode driver circuit in a vertical driver circuit.

SUMMARY OF THE INVENTION

In the single-channel common electrode driver circuit disclosed in the above-mentioned patent document 1, a transistor which outputs a common voltage of positive polarity or a common voltage of negative polarity to common electrodes corresponding to the common voltage has a gate thereof connected to a node which constitutes a floating memory node. With respect to writing of the voltage to the floating memory node, one writing (refreshing) is performed during 1 frame.

Accordingly, a leak current from the floating memory node influences the operational stability. Particularly, when the threshold voltage Vth of the transistor which is connected to the floating memory node is low, the leak current from the transistor is increased and hence, a stable operation is deteriorated resulting in a possibility of lowering of likelihood of a threshold value.

The present invention has been made to overcome the above-mentioned drawbacks of the related art, and it is an object of the present invention to provide, in a display device having a single-channel common electrode driver circuit, a technique which can enhance time-wise likelihood for a leak current from a floating memory node by increasing the number of times of writing of a voltage in the floating memory node.

The above-mentioned and other objects and novel features of the present invention will become apparent from the description of this specification and attached drawings.

To briefly explain the summary of typical inventions among the inventions disclosed in this specification, they are as follows.

(1) According to one aspect of the present invention, there is provided a display device which includes: a display panel which includes a plurality of pixels and a plurality of common electrodes; and a vertical driver circuit, wherein a vertical driver circuit includes a shift register circuit and a common electrode driver circuit, the shift register circuit is constituted of a plurality of basic circuits which outputs common electrode driving pulses based on a transfer clock inputted from the outside, the common electrode driver circuit is constituted of a plurality of common basic circuits to which the respective common electrode driving pulses outputted from the respective basic circuits of the shift register circuit and the transfer clock are inputted, and each of the common basic circuits includes: a circuit A which fetches AC signals based on the common electrode driving pulse; a circuit B which outputs, based on the AC signals fetched by the circuit A, a first common voltage or a second common voltage which differs from the first common voltage in voltage level to the common electrodes corresponding to the AC signals; and a circuit C which holds a state of the circuit B based on the transfer clock.

(2) In the display device having the above-mentioned constitution (1), the circuit A includes: a first transistor which receives inputting of the common electrode driving pulse to a control electrode thereof, and fetches a first AC signal inputted to a second electrode thereof based on the common electrode driving pulse; a second transistor which receives inputting of the common electrode driving pulse to a control electrode thereof, and fetches a second AC signal inputted to a second electrode thereof based on the common electrode driving pulse; a third transistor in diode connection which is connected to a first electrode of the first transistor; and a fourth transistor in diode connection which is connected to a first electrode of the second transistor.

(3) In the display device having the above-mentioned constitution (2), the circuit A further includes: a fifth transistor which has a second electrode thereof connected to a first electrode of the third transistor, and has a control electrode thereof connected to a first electrode of the first transistor; and a sixth transistor which has a second electrode thereof connected to a first electrode of the fourth transistor, and has a control electrode thereof connected to a first electrode of the second transistor.

(4) In the display device having the above-mentioned constitution (2) or (3), the circuit B further includes: a seventh transistor which receives inputting of the first AC signal fetched by the first transistor to a control electrode thereof, and outputs the first common voltage to a common electrode thereof corresponding to the first AC signal based on the first AC signal; and an eighth transistor which receives inputting of the second AC signal fetched by the second transistor to a control electrode thereof, and outputs the second common voltage to a common electrode thereof corresponding to the second AC signal based on the second AC signal.

(5) In the display device having the above-mentioned constitution (4), the circuit C further includes: a first capacitive element; a second capacitive element; a circuit C1 which charges the first capacitive element for every first transfer clock, and boosts a voltage of a node thereof to which the control electrode of the seventh transistor is connected via the first capacitive element for every second transfer clock which differs from the first transfer clock in phase; and a circuit C2 which charges the second capacitive element for every first transfer clock, and boosts a voltage of a node thereof to which the control electrode of the eighth transistor is connected via the second capacitive element for every said second transfer clock.

(6) In the display device having the above-mentioned constitution (5), the circuit C1 includes: a ninth transistor in diode connection which receives inputting of the first transfer clock to a second electrode thereof; a tenth transistor which has a second electrode thereof connected to a first electrode of the ninth transistor, and has a control electrode thereof connected to a control electrode of a seventh transistor; an eleventh transistor in diode connection which has a second electrode thereof connected to a first electrode of the tenth transistor, and has a first electrode thereof connected to the control electrode of the seventh transistor; and a twelfth transistor which receives inputting of the second transfer clock to a second electrode thereof, and has a control electrode thereof connected to the control electrode of the seventh transistor, wherein the first capacitive element is connected between a first electrode of the twelfth transistor and a first electrode of the tenth transistor, and the circuit C2 includes: a thirteenth transistor in diode connection which receives inputting of the first transfer clock to a second electrode thereof; a fourteenth transistor which has a second electrode thereof connected to a first electrode of the thirteenth transistor, and has a control electrode thereof connected to a control electrode of an eighth transistor; a fifteenth transistor in diode connection which has a second electrode thereof connected to a first electrode of the fourteenth transistor, and has a first electrode thereof connected to the control electrode of the eighth transistor; and a sixteenth transistor which receives inputting of the second transfer clock to a second electrode thereof, and has a control electrode thereof connected to the control electrode of the eighth transistor, wherein the second capacitive element is connected between a first electrode of the sixteenth transistor and a first electrode of the fourteenth transistor.

(7) In the display device having the above-mentioned constitution (5) or (6), the circuit C includes: the sixteenth transistor which has the second electrode thereof connected to the control electrode of the eighth transistor, and has the control electrode thereof connected to the control electrode of the seventh transistor; a seventeenth transistor which has a second electrode thereof connected to the first electrode of the sixteenth transistor, has a control electrode thereof connected to the control electrode of the seventh transistor, and receives inputting of a reference voltage to the first electrode thereof; the eighteenth transistor which has a second electrode thereof connected to the control electrode of the seventh transistor, and has the control electrode thereof connected to the control electrode of the eighth transistor; and a nineteenth transistor which has a second electrode thereof connected to a first electrode of the eighteenth transistor, has a control electrode thereof connected to the control electrode of the eighth transistor, and receives inputting of a reference voltage to the first electrode thereof.

(8) In the display device having any one of the above-mentioned constitutions (2) to (7), the first AC signal and the second AC signal are signals which make phases thereof different from each other for every 1 display line, and each of the common electrode driver circuits outputs the first common voltage and the second common voltage alternately for every 1 display line to the respective common electrodes corresponding to the first AC signal and the second AC signal.

(9) In the display device having any one of the above-mentioned constitutions (2) to (7), a voltage level of the first AC signal and a voltage level of the second AC signal are not changed within 1 frame, the voltage level of the first AC signal and a voltage level of the second AC signal are inverted within a next frame, and the respective common electrode driver circuits alternately output the first common voltage and the second common voltage for every 1 frame to the respective common electrodes corresponding to the first AC signal and the second AC signal.

To briefly explain advantageous effects obtained by the typical inventions among the inventions disclosed in this specification, they are as follows.

According to the present invention, in the display device having a single-channel common electrode driver circuit, the number of times of writing of a voltage in the floating memory node can be increased thus enhancing time-wise likelihood for a leak current from the floating memory node.

DETAILED DESCRIPTION OF THE INVENTION

Hereinafter, an embodiment in which the present invention is applied to a liquid crystal display device is explained in detail in conjunction with drawings.

Here, in all drawings for explaining the embodiment, parts having identical functions are given same symbols and their repeated explanation is omitted.

Figure 1:
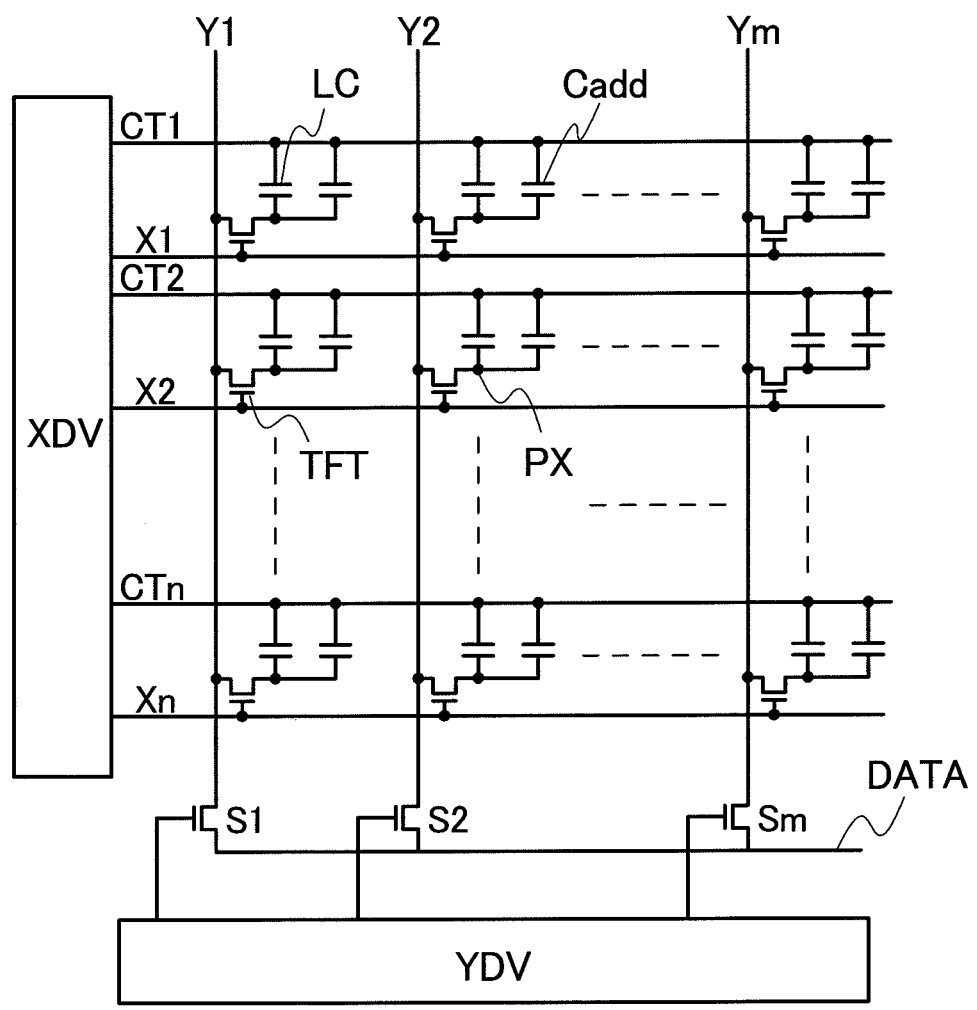
FIG. 1 is a circuit diagram showing an equivalent circuit of a liquid crystal display device of an embodiment according to the present invention.

FIG. 1 is a circuit diagram showing an equivalent circuit of a liquid crystal display device of an embodiment according to the present invention.

As shown in FIG. 1, the liquid crystal display device of this embodiment includes, on a liquid-crystal surface of one substrate out of a pair of substrates which is arranged to face each other in an opposed manner with liquid crystal therebetween, n pieces of scanning signal lines (also referred to as gate lines) (X1, X2, ... Xn) which extend in the x direction, n pieces of common electrodes (also referred to as common lines) (CT1, CT2, ... CTn) which extend in the x direction, and m pieces of video signal lines (also referred to as drain lines or source lines) (Y1, Y2, ... Ym) which intersect with the x direction and extend in the y direction.

Regions which are surrounded by the scanning signal lines and the video signal lines constitute pixel regions. Each pixel region is provided with a pixel-use transistor (TFT) which has a gate thereof connected to the scanning signal line, a drain (or a source) thereof connected to the video signal line, and a source (or a drain) thereof connected to a pixel electrode (PX). Further, liquid crystal capacity (LC) and a holding capacitance (Cadd) are formed between the pixel electrode (PX) and common electrodes (CT1, CT2, ... CTn).

The respective scanning signal lines (X1, X2, Xn) are connected to a vertical driver circuit (XDV), and the vertical driver circuit (XDV) sequentially supplies a selection scanning signal to the scanning signal lines in order from the scanning signal line X1 to the scanning signal line Xn (or in order from the scanning signal line Xn to the scanning signal line X1).

The respective common electrodes (CT1, CT2, ... CTn) are connected to the vertical driver circuit (XDV), and the vertical driver circuit (XDV) performs AC driving by sequentially changing over polarity of a voltage applied to common electrodes (CT1, CT2, ... CTn) in order from the common electrode CT1 to CTn (or in order from the common electrode CTn to CT1) at the same timing as the selection scanning signal. The respective video signal lines (Y1, Y2, ... Ym) are connected to drains (or sources) of switching elements (S1, S2, ... Sm). The switching elements (S1, S2, ... Sm) have sources (or drains) thereof connected to video lines (DATA) and have gates thereof connected to a horizontal driver circuit (YDV). By the horizontal driver circuit (YDV), scanning is sequentially performed in order from the switching element S1 to the switching element Sm (or in order from the switching element Sm to the switching element S1).

The liquid crystal display panel of this embodiment is constituted as follows. The first substrate on which the pixel electrodes, the thin film transistors and the like are formed (also referred to as TFT substrate or active matrix substrate) (not shown in the drawing) and the second substrate on which color filters and the like are formed (also referred to as counter substrate) (not shown in the drawing) are overlapped with each other with a predetermined gap therebetween, both substrates are adhered to each other by a sealing material which is formed in a frame shape in the vicinity of peripheral portions of both substrates, liquid crystal is filled and sealed in a space defined inside the sealing material between both substrates through a liquid crystal filling port formed in a portion of the sealing material, and a polarizer is laminated to outer surfaces of both substrates.

In this manner, the liquid crystal display panel of this embodiment adopts the structure in which liquid crystal is sandwiched between a pair of substrates. Further, the counter electrodes are formed on a counter substrate side when the liquid crystal display panel is a TN-type or VA-type liquid crystal display panel. When the liquid crystal display panel is an IPS (In Plane Switching)-type liquid crystal display panel, the counter electrodes are formed on a TFT substrate side. Since the present invention is not relevant to the inner structure of the liquid crystal display panel, the detailed explanation of the inner structure of the liquid crystal display panel is omitted. Further, the present invention is applicable to a liquid crystal display panel having any structure. Still further, although a backlight is arranged on a back surface side of the liquid crystal display panel, since the present invention is not relevant to the inner structure of the backlight, the detailed explanation of the inner structure of the backlight is also omitted in this specification.

In this embodiment, with respect to transistors which are used in the vertical driver circuit (XDV) and the horizontal driver circuit (YDV) respectively, a semiconductor layer is made of polycrystalline silicon (polysilicon), and is formed on a surface of one substrate in the same step as the thin film transistor which constitutes the active element.

Prior to the explanation of the vertical driver circuit of this embodiment, the constitution of a conventional vertical driver circuit is explained.

Figure 5:
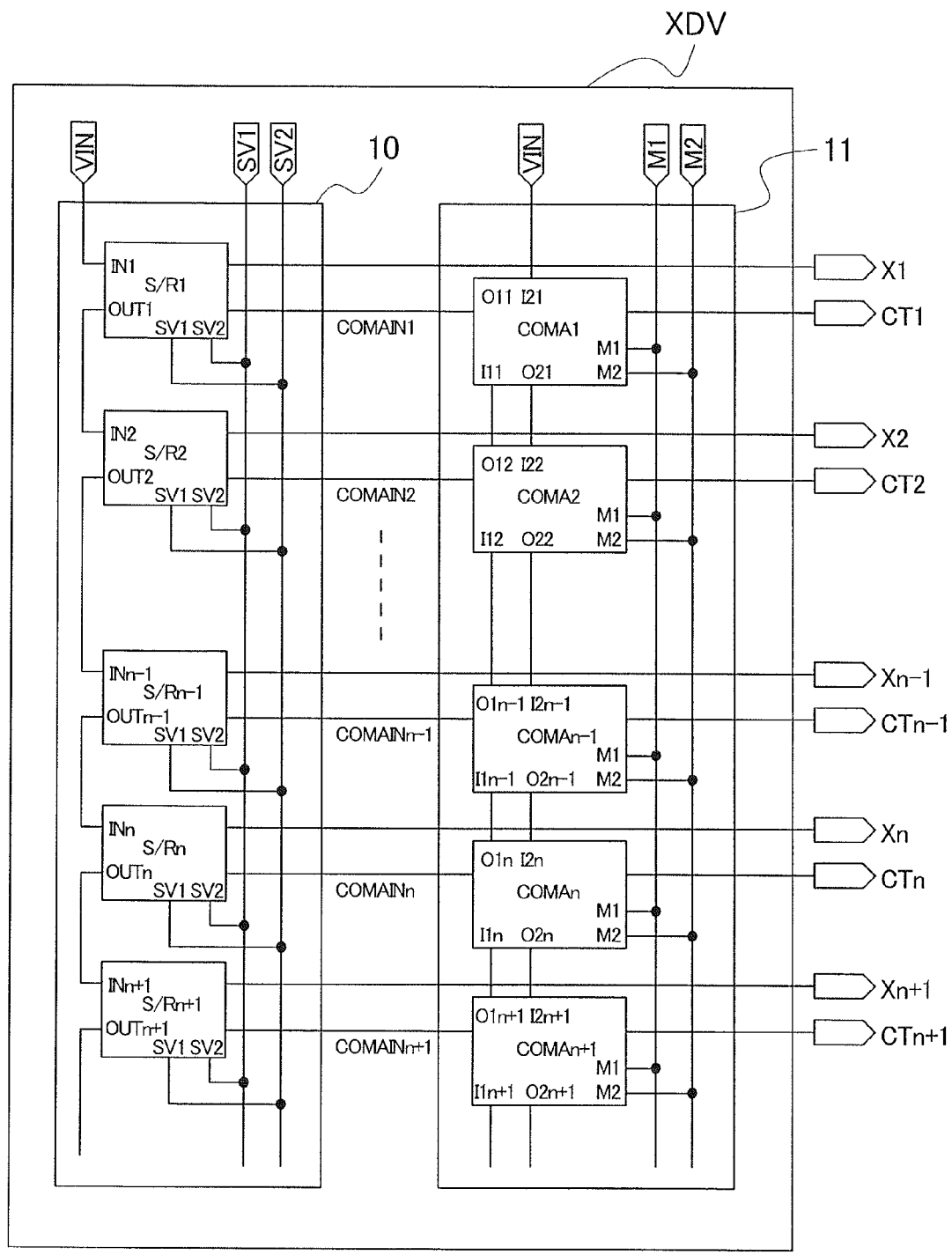
FIG. 5 is a block diagram showing the schematic constitution of a conventional vertical driver circuit.

FIG. 5 is a block diagram showing the schematic constitution of the conventional vertical driver circuit.

In FIG. 5, symbol 10 indicates a shift register circuit, symbol 11 indicates a common electrode driver circuit, symbol S/R indicates a plurality of basic circuits which constitutes the shift register circuit 10, and symbol COMA indicates a plurality of common basic circuits which constitutes the common electrode driver circuit.

The nth common basic circuit (COMAn) has an output terminal (O1n) and an input terminal (I2n) thereof connected to the preceding-stage common basic circuit (COMAn−1), while the nth common basic circuit (COMAn) has an input terminal (I1n) and an output terminal (O2n) thereof connected to the succeeding-stage common basic circuit (COMAn+1). Here, a start pulse (VIN) is inputted to an input terminal (I2l) of the first-stage common basic circuit (COMA1).

Figure 6:
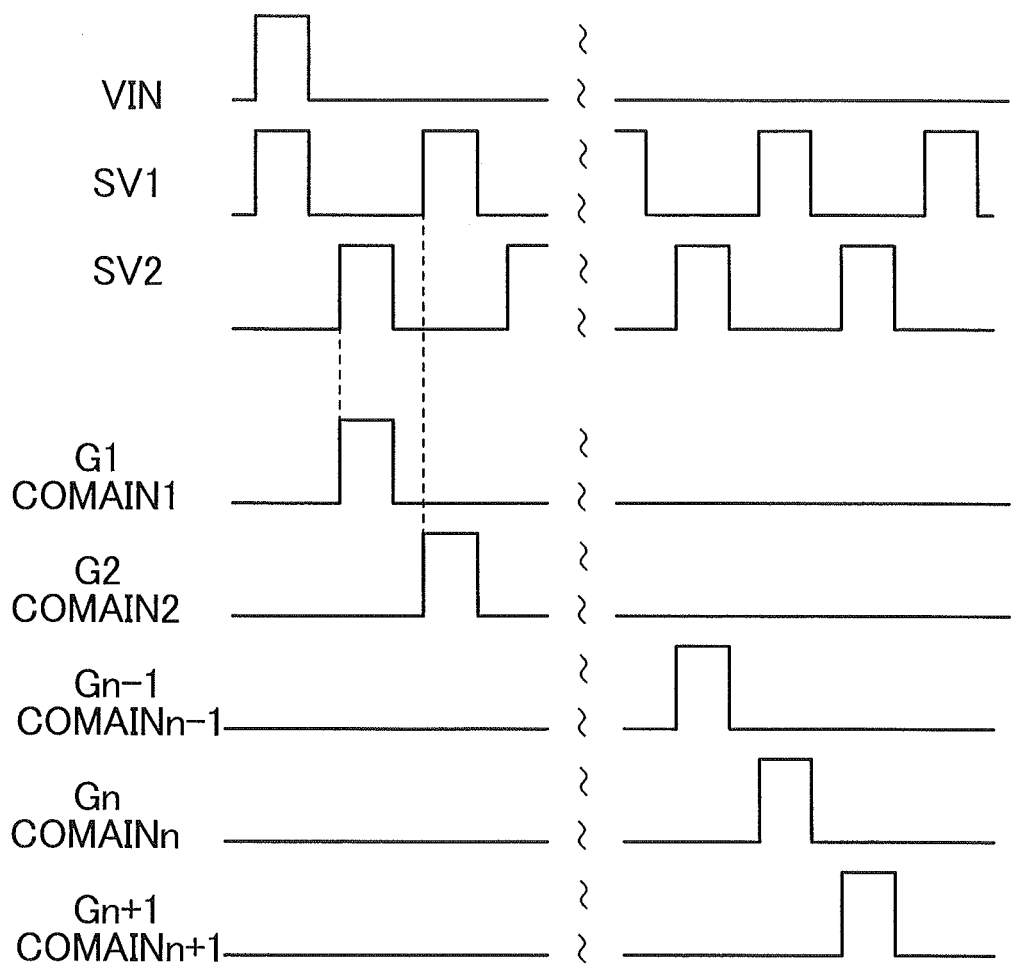
FIG. 6 is a timing chart showing input signals inputted to a shift register circuit shown in FIG. 5 and output signals outputted from the shift register circuit.

FIG. 6 shows input signals and output signals of the shift register circuit 10.

Driving of the shift register circuit 10 is started when the start pulse (VIN) is inputted to the first-stage basic circuit (S/R1) and the shift register circuit 10 outputs signals whose phases are shifted by 1 clock for every stage from an uppermost stage to a lowermost stage in synchronism with a first transfer clock (SV1) and a second transfer clock (SV2).

Each basic circuit (S/R) outputs a selection scanning voltage supplied to the respective scanning signal lines (G) and a common-electrode-driving pulse (COMAIN) which is inputted to each common basic circuit (COMA).

Figure 7:
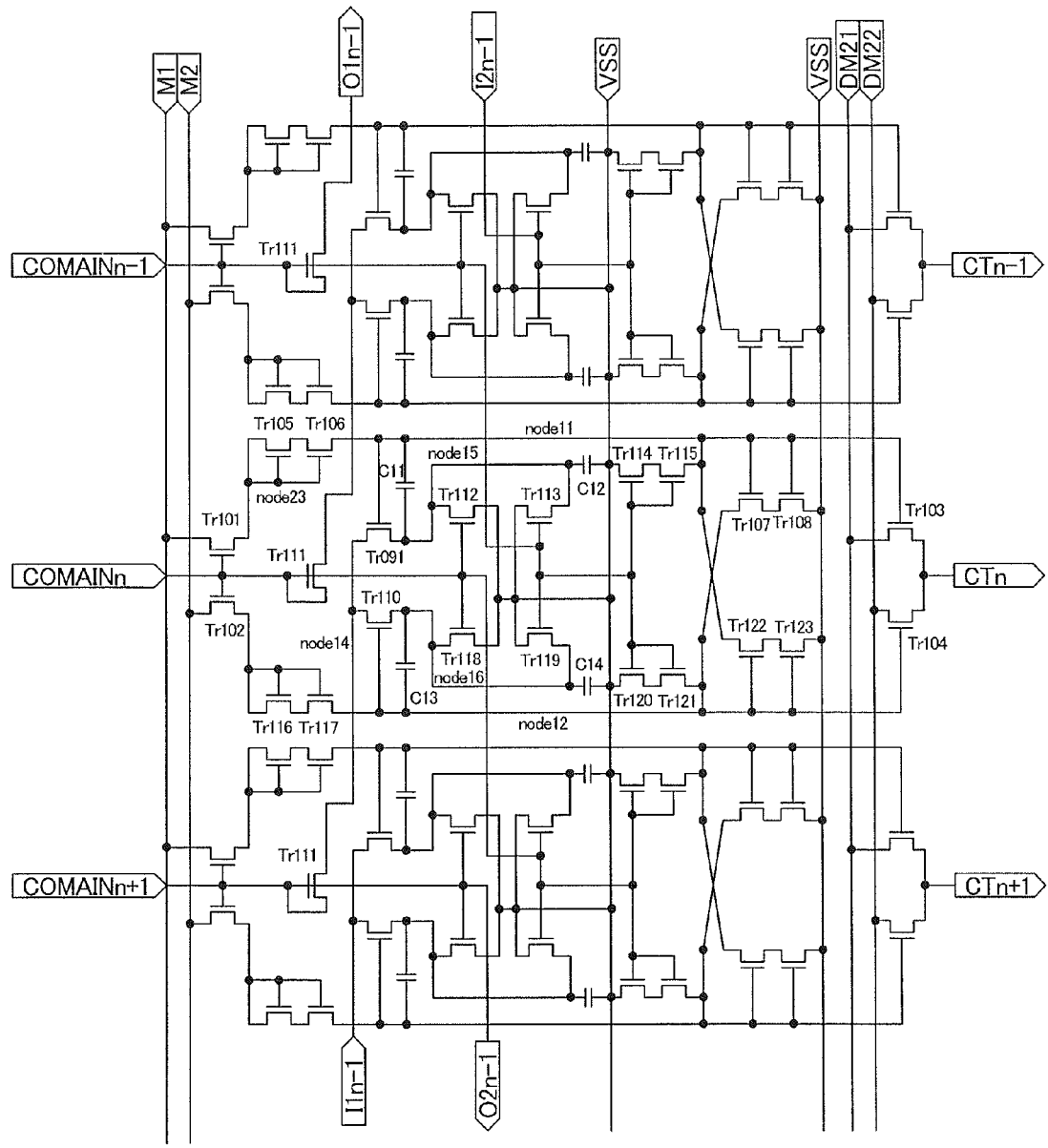
FIG. 7 is a circuit diagram showing the circuit constitution of a common basic circuit shown in FIG. 5.

FIG. 7 shows the circuit constitution of the common basic circuit (COMA) shown in FIG. 5.

In n-type MOS transistors (hereinafter, simply referred to as transistors) (Tr101, Tr102), when the common-electrode-driving pulse (COMAIN) assumes a High level (hereinafter, referred to as H level), one of two nodes consisting of a node (node11) and a node (node12) assumes an H level and another node assumes a Low level (hereinafter, referred to as L level) in response to voltage level of AC signals M1, M2.

When the node (node11) assumes an H level, a transistor (Tr103) is turned on so that a common voltage (CM11) of positive polarity is outputted to the common electrode (CT), while when the node (node12) assumes an H level, a transistor (Tr104) is turned on so that a common voltage (CM12) of negative polarity is outputted to the common electrode (CT).

In this specification, "positive polarity" in the term "common voltage of positive polarity" implies that the common voltage is on a high potential side compared to a voltage applied to the pixel electrode (PX), and whether or not the common voltage is larger or smaller than 0V does not matter.

In the same manner, "negative polarity" in the term "common voltage of negative polarity" implies that the common voltage is on a low potential side compared to a voltage applied to the pixel electrode (PX), and whether or not the common voltage is larger or smaller than 0V does not matter.

In transistors (Tr105, Tr106), when the common-electrode-driving pulse (COMAIN) is changed from an H level to an L level (that is, when a node (node13) is changed from an H level to an L level), the H level of the node (node11) is held. In the same manner, in transistors (Tr116, Tr117), when the common-electrode driving pulse (COMAIN) is changed from an H level to an L level, the H level of the node (node12) is held.

Transistors (Tr107, Tr108) completely hold the node (node12) at an L level during a period in which the node (node11) assumes an H level thus preventing the node (node11) and the node (node12) from assuming the H level simultaneously. In the same manner, transistors (Tr122, Tr123) completely hold the node (node11) at an L level during a period in which the node (node12) assumes an H level thus preventing the node (node11) and the node (node12) from assuming the H level simultaneously.

In a transistor (Tr109) to which a succeeding-stage common-electrode-driving pulse (COMAINn+1) is inputted via a transistor (Tr111), when the node (node11) is in an H-level state, a node (node15) assumes an H level. In the same manner, in a transistor (Tr110), when the node (node12) is in an H-level state, a node (node16) also assumes an H level.

In the transistor (Tr111) in diode connection, when the common electrode driving pulse (COMAINn+1) is changed from an H level to an L level, a node (node14) is held at an H level.

A capacitive element (C11) holds the H-level state of the node (node11) and, at the same time, when the node (node15) is changed from an L level to an H level, boosts a voltage of the node (node11) thus making the voltage of the node (node11) higher than the H level whereby ON resistance of a transistor (Tr103) is lowered. A capacitive element (C13) also performs an operation similar to the operation of the capacitive element (C11).

A capacitive element (C12) holds an H-level state of the node (node15). A capacitive element (C14) holds an H-level state of the node (node16).

A transistor (Tr112) is provided for preventing a voltage of the node (node15) from being boosted by the capacitive element (C11) when the node (node11) is changed from the L level to the H level. In the same manner, a transistor (Tr118) is provided also for preventing a voltage of the node (node16) from being boosted by the capacitive element (C13) when the node (node12) is changed from the L level to the H level.

In a transistor (Tr113), when the preceding-stage common-electrode-driving pulse (COMAINn−1) assumes an H level, the node (node15) assumes an L level. In the same manner, in a transistor (Tr119), when the preceding-stage common-electrode-driving pulse (COMAINn−1) assumes an H level, the node (node16) assumes an L level.

In transistors (Tr114, Tr115), when the preceding-stage common-electrode-driving pulse (COMAINn−1) assumes an H level, the node (node11) assumes an L level. In the same manner, in transistors (Tr120, Tr121), when the preceding-stage common-electrode-driving pulse (COMAINn−1) assumes an H level, the node (node12) assumes an L level.

Figure 8:
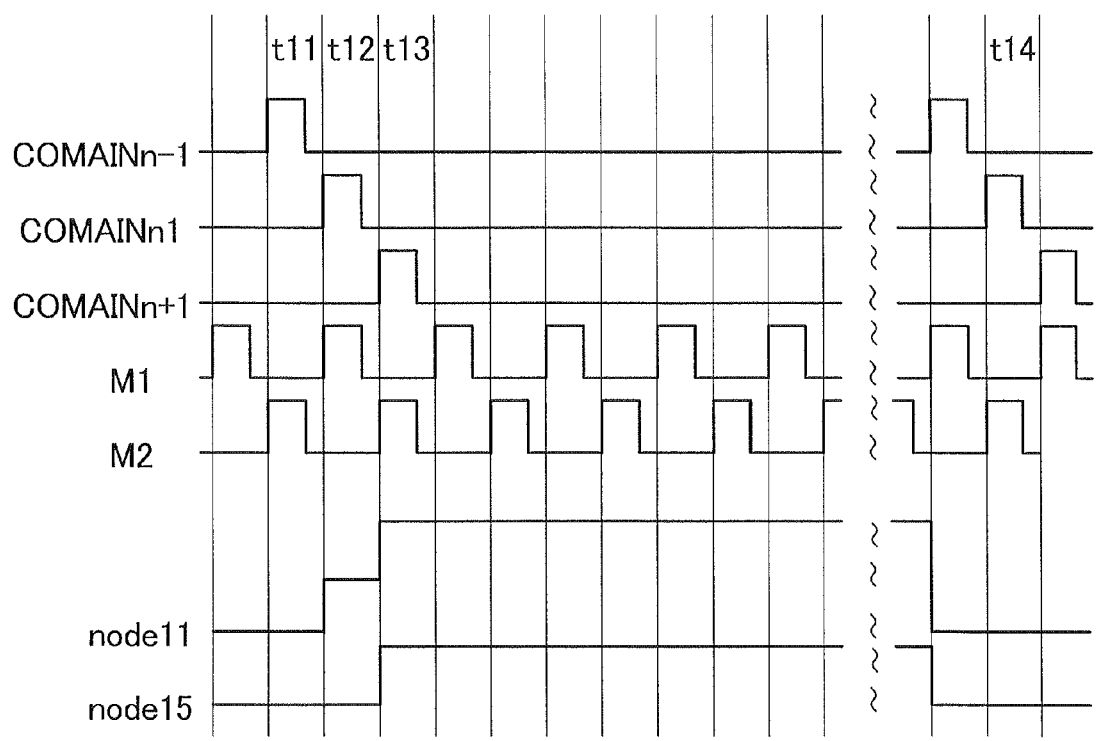
FIG. 8 is a timing chart showing input signals inputted to the circuit shown in FIG. 7 and voltage changes at respective nodes.

FIG. 8 shows the input signals inputted to the circuit shown in FIG. 7 and voltage changes at the respective nodes.

When the preceding-stage common-electrode driving pulse (COMAINn−1) assumes an H level during a period t11, the transistors (Tr113 to Tr115) and the transistors (Tr119 to Tr121) are turned on so that the node (node11), the node (node12), the node (node15) and the node (node16) assume an L level.

Next, when the own-stage common electrode driving pulse (COMAINn) assumes an H level during a period t12, the transistors (Tr101, Tr102) are turned on. Further, when the AC signal (M1) assumes an H level simultaneously with such an operation, the transistors (Tr105, Tr106) are turned on and hence, the node (node11) assumes an H level whereby the capacitive element (C11) is charged with electricity.

During a period in which the node (node11) holds the H level, the node (node12) is fixed to the L level by the transistors (Tr107, Tr108). Further, at this point of time, the node (node15) which constitutes a floating node is fixed to the L level since the transistor (Tr112) is turned on.

The node (node11) holds an H-level state due to the capacitive element (C11) and hence, the transistor (Tr109) is in an ON state. In such a state, when the succeeding-stage common-electrode-driving pulse (COMAINn+1) assumes an H level during a period t13, the node (node15) assumes an H level.

When the node (node15) assumes an H level, a voltage of the node (node11) is boosted (or charged up) by the capacitive element (C11) and hence, the voltage of the node (node11) is set higher than the H level whereby ON resistance of the transistor (Tr103) is lowered.

In the next frame, phases of AC signals (M1, M2) are inverted, and when the preceding-stage common electrode driving pulse (COMAINn−1) assumes an H level during a period t14, the node (node11), the node (node12), the node (node11) and the node (node15) assume an L level. Hereinafter, the similar operations are performed at the node (node12).

In the common basic circuit (COMA) shown in FIG. 7, the nodes to which the gates of the transistors (Tr103, Tr104) which output the common voltage (CM11) of positive polarity or the common voltage (CM12) of negative polarity to the respective common electrodes are connected constitute floating memory nodes (node11, node12) and writing of a voltage to such floating memory nodes is performed such that the writing (refreshing) is preformed one time for every 1 frame.

Accordingly, a leak current from the transistors connected to the floating memory nodes (node11, node12) influences the operational stability. Particularly, when the threshold voltage Vth of the transistor which is connected to the floating memory node (node11, node12) is low, the leak current from the transistor is increased and hence, a stable operation is deteriorated resulting in a possibility of lowering of likelihood of a threshold value.

Further, the common basic circuit (COMA) requires, as constitutional elements thereof, (a) a capacity element (C11) for holding and boosting a voltage of the node (node 11), a capacity element (C13) for holding and boosting a voltage of the node (node 12), a capacity element (C12) for holding and boosting a voltage of the node (node 15), and a capacity element (C14) for holding and boosting a voltage of the node (node 16), and (b) resetting transistors (Tr107, Tr108, Tr114, Tr115) for the node (node 11), resetting transistors (Tr122, Tr123, Tr120, Tr121) for the node (node 12), resetting transistors (Tr112, Tr113) for the node (node 15), and resetting transistors (Tr118, Tr119) for the node (node 16). In this manner, the common basic circuit (COMA) requires a large number of elements and hence, it is difficult to decrease a circuit scale of the common basic circuit (COMA).

Figure 2:
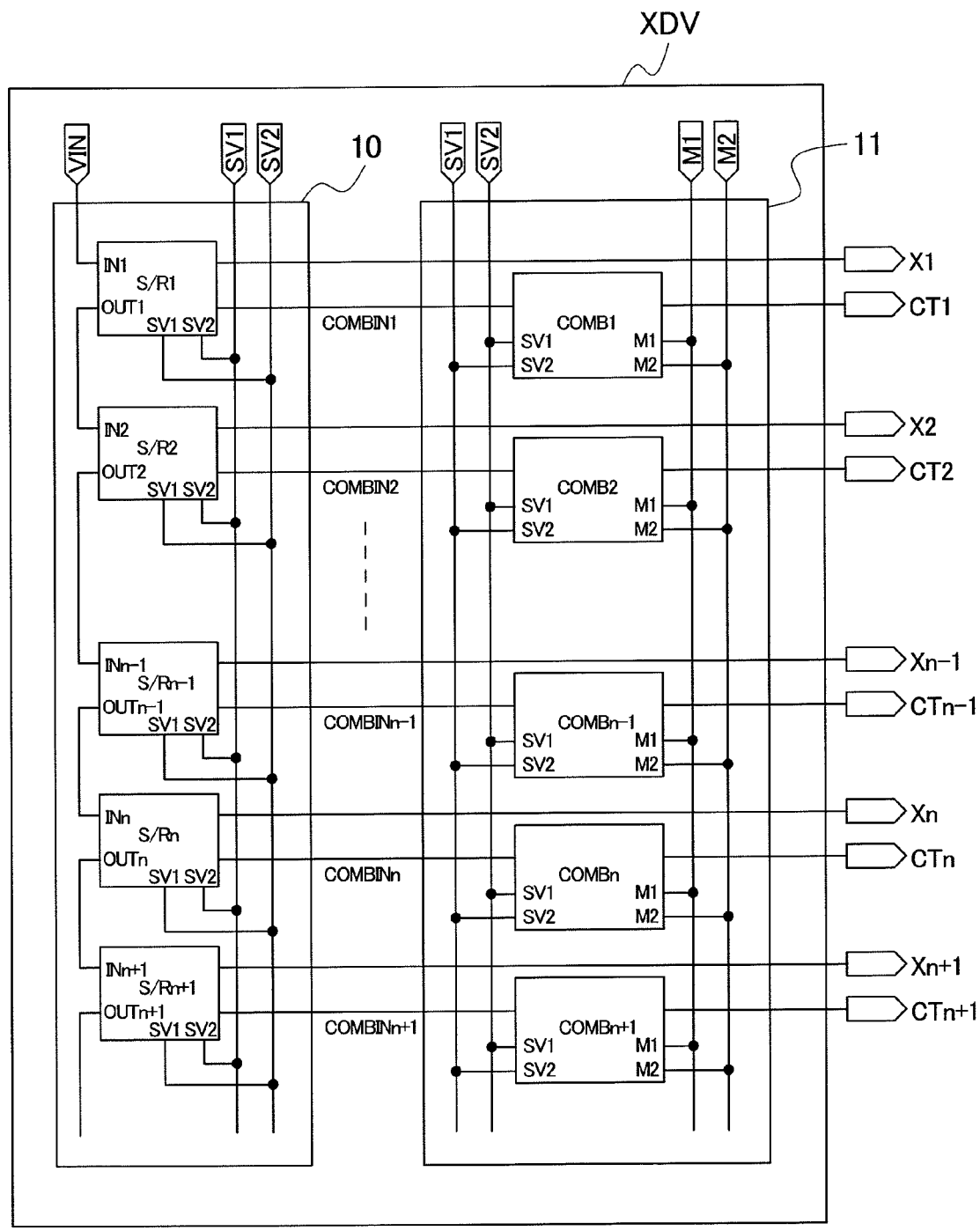
FIG. 2 is a block diagram showing the schematic constitution of a vertical driver circuit of the embodiment according to the present invention.

FIG. 2 is a block diagram showing the schematic constitution of the vertical driver circuit of this embodiment.

As shown in FIG. 2, in this embodiment, each common basic circuit (COMB) of the common electrode driver circuit 11 receives inputting of no signals from the preceding-stage or succeeding-stage common basic circuit, and first and second transfer clocks (SV1, SV2) are inputted to each common basic circuit (COMB).

Also in this embodiment, input signals inputted to the shift register circuit 10 and output signals outputted from the shift register circuit 10 are equal to the input signals and output signals shown in FIG. 6. The shift register circuit 10 starts driving thereof when a start pulse (VIN) is inputted to the first-stage basic circuit (S/R1), and performs a function of outputting signals whose phases are shifted by 1 clock for every stage from an uppermost stage to a lowermost stage in synchronism with the first transfer clock (SV1) and the second transfer clock (SV2).

Each basic circuit (S/R) outputs a selection scanning voltage supplied to the respective scanning signal lines (G) and a common electrode driving pulse (COMBIN) inputted to each common basic circuit (COMA).

Figure 3:
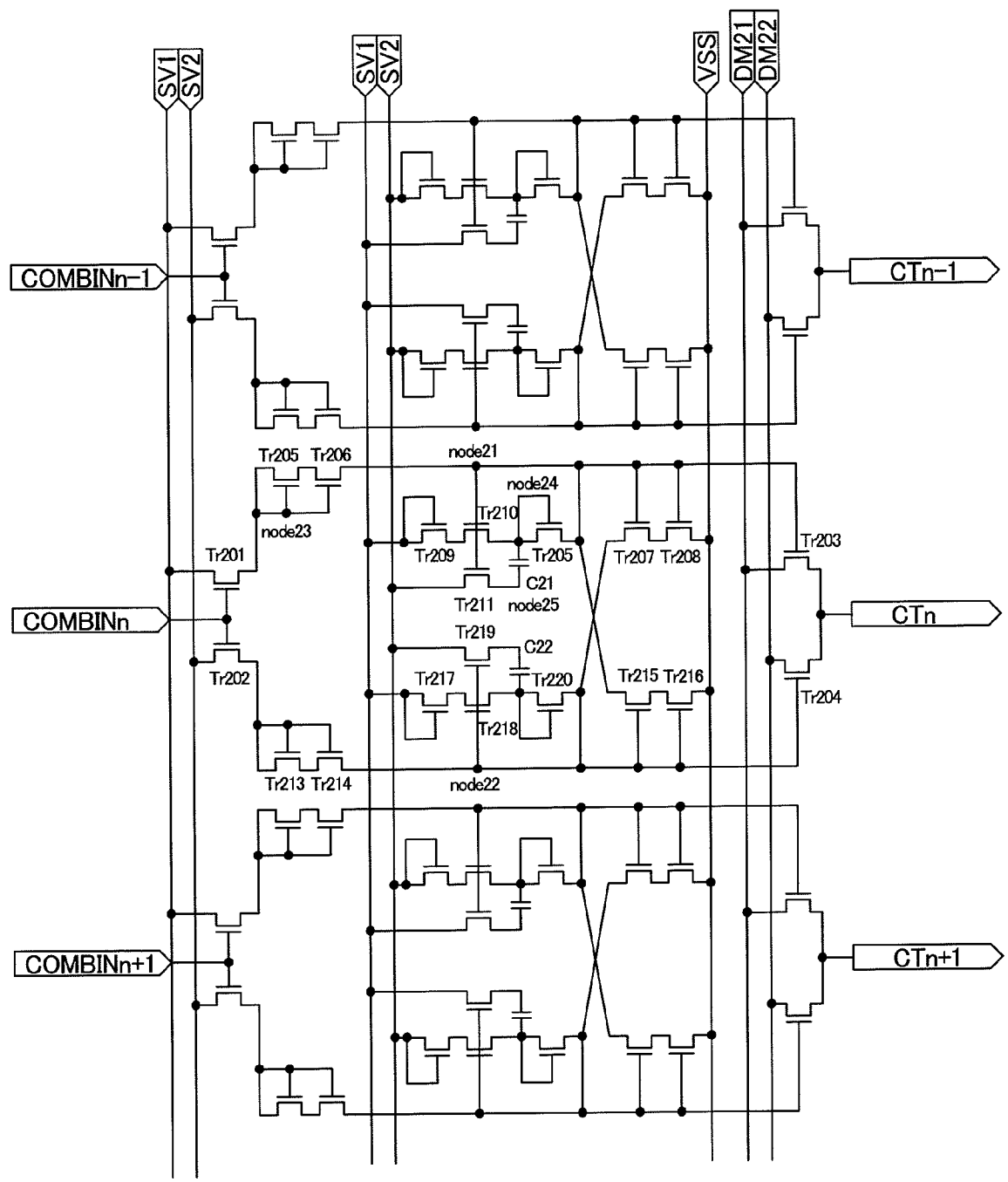
FIG. 3 is a circuit diagram showing the circuit constitution of a common basic circuit shown in FIG. 2.

FIG. 3 shows the circuit constitution of the common basic circuit (COMB) shown in FIG. 2.

A common-electrode-driving pulse (COMBIN) is inputted to a gate of the transistor (Tr201), and an AC signal (M1) is inputted to a drain of the transistor (Tr201). Further, a transistor (Tr205) in diode connection is connected to a source of the transistor (Tr201), a drain of a transistor (Tr206) is connected to a source of a transistor (Tr205), and a gate of the transistor (Tr206) is connected to a source of the transistor (Tr201).

Further, a common-electrode-driving pulse (COMBIN) is inputted to a gate of the transistor (Tr202), and an AC signal (M2) is inputted to a drain of the transistor (Tr202). Further, a transistor (Tr213) in diode connection is connected to a source of the transistor (Tr202), a drain of a transistor (Tr214) is connected to a source of a transistor (Tr213), and a gate of the transistor (Tr214) is connected to a source of the transistor (Tr202).

A source of the transistor (Tr206) is connected to a gate of the transistor (Tr203), and the common voltage (CM21) of positive polarity is inputted to a drain of the transistor (Tr203). In the same manner, a source of the transistor (Tr214) is connected to a gate of the transistor (Tr204), and the common voltage (CM22) of negative polarity is inputted to a drain of the transistor (Tr204).

In the transistors (Tr201, Tr202), when the common electrode driving pulse (COMBIN) assumes a High level (hereinafter referred to as H level), one of two nodes consisting of the node (node21) and the node (node22) assumes an H level and another node assumes a Low level (hereinafter referred to as L level) in response to voltage levels of AC signals (M1, M2).

When the node (node21) assumes an H level, the transistor (Tr203) is turned on so that the common voltage (CM21) of positive polarity is outputted to the common electrode (CT), while when the node (node22) assumes an H level, the transistor (Tr204) is turned on so that the common voltage (CM22) of negative polarity is outputted to the common electrode (CT).

In transistors (Tr205, Tr206), when the common-electrode-driving pulse (COMBIN) is changed from an H level to an L level, the H level of the node (node21) is held. In the same manner, in transistors (Tr213, Tr214), when the common-electrode-driving pulse (COMBIN) is changed from an H level to an L level, the H level of the node (node22) is held.

The transistors (Tr207, Tr208) which are connected between a source of the transistor (Tr220) and the reference voltage (VSS) have respective gates thereof connected to the gate of the transistor (Tr203). Further, the transistors (Tr215, Tr216) which are connected between a source of the transistor (Tr212) and the reference voltage (VSS) have respective gates thereof connected to the gate of the transistor (Tr204).

Transistors (Tr207, Tr208) completely hold the node (node22) at an L level during a period in which the node (node21) assumes an H level thus preventing the node (node21) and the node (node22) from assuming the H level simultaneously. In the same manner, transistors (Tr215, Tr216) completely hold the node (node21) at an L level during a period in which the node (node22) assumes an H level thus preventing the node (node21) and the node (node22) from assuming the H level simultaneously.

Compared to the constitution of a conventional circuit shown in FIG. 7, in this embodiment, a circuit which is constituted of the transistors (Tr209 to Tr212) and the capacitive element (C21) is added to a node (node21) side, and a circuit which is constituted of the transistors (Tr217 to Tr219) and the capacitive element (C22) is added to a node (node22) side.

That is, on the node (node21) side, the transistor (Tr210) is connected between a source of the transistor (Tr209) in diode connection and a drain of the transistor (Tr212) in diode connection, and a source of the transistor (Tr212) is connected to a gate of the transistor (Tr203). Further, a capacitive element (C21) is connected between a drain of the transistor (Tr212) and a source of the transistor (Tr211).

Here, a gate of the transistor (Tr210) and a gate of the transistor (Tr211) are connected to a gate of the transistor (Tr203). Further, a first transfer clock (SV1) is inputted to a drain of the transistor (Tr209), and a second transfer clock (SV2) is inputted to a drain of the transistor (Tr211).

The transistor (Tr210) assumes an ON state during a period in which the node (node21) is at an H level and hence, when the first transfer clock (SV1) assumes an H level, the node (node24) assumes an H level. This H level of the node (node24) is held by the capacitive element (C21).

The transistor (Tr211) assumes an ON state during the period in which the node (node21) is at an H level and hence, when the second transfer clock (SV2) assumes an H level, a voltage of the node (node24) is boosted (charged up) for every second transfer clock (SV2) by the capacitive element (C21). Accordingly, a voltage of the node (node21) is also boosted via the transistor (Tr212) in diode connection. The circuit on the node (node22) side has the similar constitution as the above-mentioned circuit on the node (node21) side.

Figure 4A:
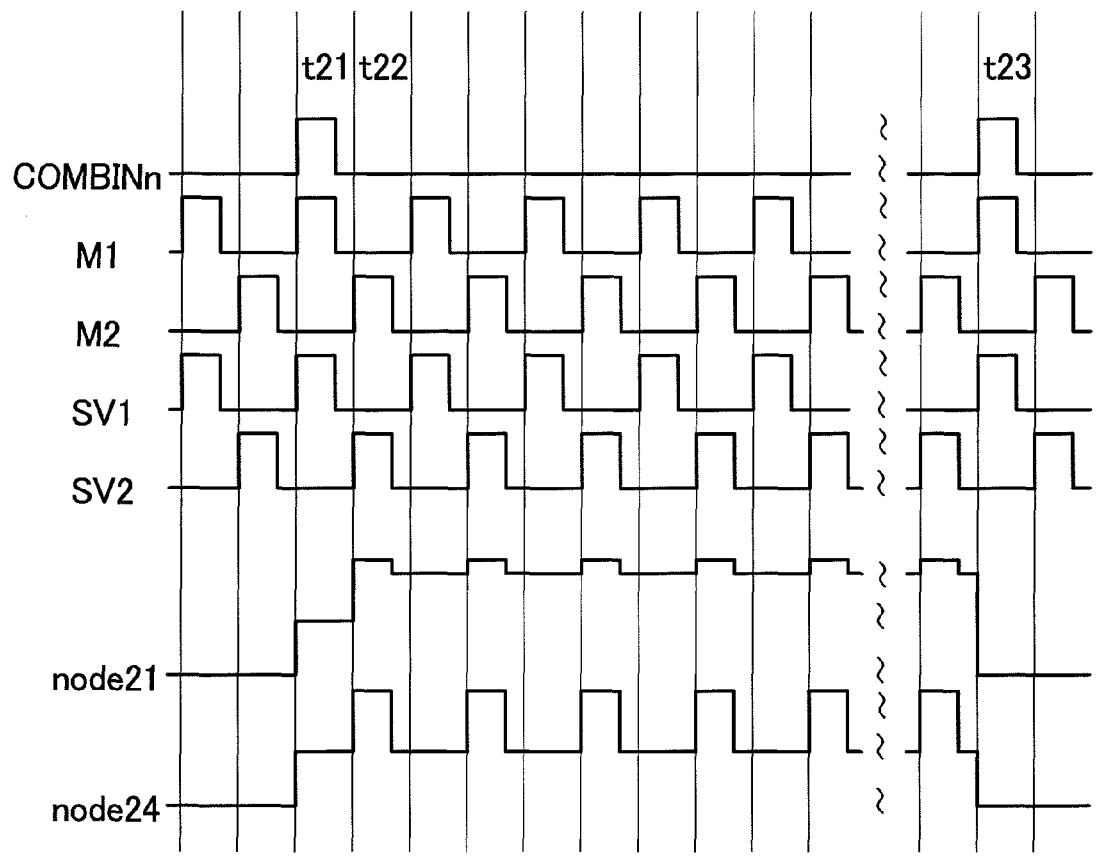
FIG. 4A is a timing chart showing input signals inputted to the circuit shown in FIG. 3 and voltage changes at respective nodes.

FIG. 4A shows the input signals inputted to the circuit shown in FIG. 3 and voltage changes at the respective nodes.

When the own-stage common-electrode-driving pulse (COMBINn) assumes an H level during a period t21, the transistors (Tr201, Tr202) are turned on. Further, when an AC signal (M1) assumes an H level simultaneously with such an operation, the transistors (Tr205, Tr206) are turned on so that the node (node21) assumes an H level.

During a period in which the node (node21) is at an H level, the voltage of the node (node22) is fixed to an L level by the transistors (Tr207, Tr208). Here, the first transfer clock (SV1) is also at an H level and hence, the node (node24) also assumes an H level, and this H level is held by the capacitive element (C21).

The transistor (Tr211) is in an ON state during a period in which the node (node21) is at the H level and hence, when the second transfer clock (SV2) assumes an H level during a period t22, the voltage of the node (node24) is boosted. Accordingly, the voltage of the node (node21) becomes higher than the H level via the transistor (Tr212) and hence, the ON resistance of the transistor (Tr203) is lowered.

In the next frame, the AC signals M1, M2 are inverted so that the node (node22) assumes an H level, and the voltage of the node (node22) is boosted for every second transfer clock (SV2).

In the above-mentioned explanation, the case in which the scanning-signal-line sequential driving adopts the 1 line inversion AC driving method has been explained. However, the present invention is applicable to a case in which the scanning-signal-line sequential driving adopts a frame inversion AC driving method.

Figure 4B:
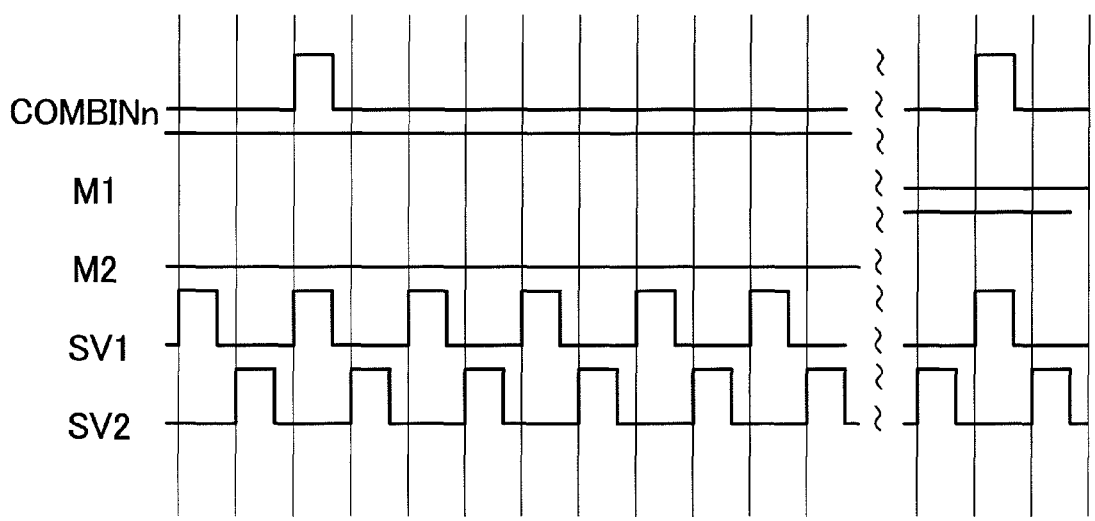
FIG. 4B is a timing chart showing a modification of the input signals inputted to the circuit shown in FIG. 3.

When the scanning-signal-line sequential driving adopts the frame inversion AC driving method, as AC signals M1, M2, as shown in FIG. 4B, AC signals whose voltage levels are inverted for every 1 frame are inputted.

With the use of such AC signals, for example, when the AC signal (M1) is at an H level during 1 frame period, a voltage of the H level is constantly applied to the node (node21) of each common basic circuit (COMB) and hence, only the common voltage (CM21) of positive polarity is outputted to all scanning signal lines.

In the next frame, the phase of the AC signal (M1) and the phase of the AC signal (M2) are inverted so that only the common voltage (CM22) of negative polarity is outputted to all scanning signal lines.

As has been explained heretofore, in this embodiment, using one of pair of clocks consisting of first and second transfer clocks (using the second transfer clock (SV2) in FIG. 3), the voltages of the floating memory nodes (node21, node22) are boosted for every clock.

Accordingly, in this embodiment, compared to a conventional circuit in which a voltage is written in a memory node one time during 1 cycle, it is possible to remarkably reinforce a stable operation against a leak current thus allowing the driver circuit to maintain high operational stability. To take a common electrode driver circuit having the 240-stage constitution as an example, compared to the conventional circuit, according to this embodiment, the restriction on a holding time of the floating memory node can be alleviated approximately 120 times. That is, this implies that the likelihood for the leak current from the transistor connected to the floating memory nodes (node21, node22) is increased approximately 120 times thus realizing the deregulation of standards on threshold voltages Vth of using transistors.

Further, in this embodiment, to lower ON resistances of the transistors (Tr203, Tr204), the transfer clocks SV1, SV2 are used without using next-stage outputs. Accordingly, each common basic circuit (COMB) requires, as constitutional elements thereof, (a) the capacitive element (C21) for holding and boosting the voltage of the node (node21) and the capacitive element (C22) for holding and boosting the voltage of the node (node22), and (b) the resetting transistors (Tr207, Tr208) for the node (node21) and the resetting transistors (Tr215, Tr216) for the node (node22). However, different from the conventional circuit, elements for holding and resetting the next-stage output are unnecessary and hence, this embodiment can decrease a circuit scale of the common basic circuit (COMB).

Accordingly, this embodiment can realize not only the easy narrowing of a picture frame but also, and the reduction of a manufacturing cost acquired by the enhancement of a yield rate due to the enlargement of time-wise likelihood for a leak current from the floating memory node and the increase of the number of liquid crystal panels which are manufactured from one substrate due to the realization of a compact circuit.

In the above-mentioned explanation, the case in which the common electrode driver circuit is constituted of the n-type thin film transistors has been explained. However, in this embodiment, the common electrode driver circuit can adopt not only the n-MOS single-channel constitution formed of the n-type thin film transistors but also the p-MOS single-channel constitution formed of p-type thin film transistors. In this case, a reference voltage VSS assumes an H level so that logic of the common electrode driver circuit is inverted.

Further, in the above-mentioned explanation, the case in which the MOS (Metal Oxide Semiconductor)-type TFTs are used as transistors has been explained. However, general-type MOS-FETs or MIS (Metal Insulator Semiconductor) type-FETs or the like can be also used as transistors applicable to the present invention.

Further, in the above-mentioned explanation, the explanation is made with respect to the embodiment in which the present invention is applied to the liquid crystal display module. However, it is needless to say that the present invention is not limited to such a liquid crystal display module and, for example, the present invention is applicable to an EL display device which uses organic EL elements or the like.

Although the invention made by inventors of the present invention has been specifically explained based on the embodiment, it is needless to say that the present invention is not limited to such an embodiment, and various modifications can be made without departing from the gist of the present invention.

What is claimed is:

1. A display device comprising a display panel which includes a plurality of pixels and a plurality of common electrodes; and
   a vertical driver circuit, wherein:
   the vertical driver circuit includes a shift register circuit and a common electrode driver circuit,
   the shift register circuit is comprised of a plurality of basic circuits which outputs common electrode driving pulses based on a transfer clock,
   the common electrode driver circuit is comprised of a plurality of common basic circuits to which the respective common electrode driving pulses outputted from the respective basic circuits of the shift register circuit and the transfer clock are inputted, and
   each of said common basic circuits includes:
   a circuit A which fetches AC signals based on the common electrode driving pulse;
   a circuit B which outputs, based on the AC signals fetched by the circuit A, a first common voltage or a second common voltage which differs from the first common voltage in voltage level to the common electrodes corresponding to the AC signals; and
   a circuit C which holds a state of the circuit B based on the transfer clock,
   wherein the circuit A includes:
   a first transistor which receives inputting of the common electrode driving pulse to a control electrode thereof, and fetches a first AC signal inputted to a second electrode thereof based on the common electrode driving pulse;
   a second transistor which receives inputting of the common electrode driving pulse to a control electrode thereof, and fetches a second AC signal inputted to a second electrode thereof based on the common electrode driving pulse;
   a third transistor in diode connection which is connected to a first electrode of the first transistor; and a fourth transistor in diode connection which is connected to a first electrode of the second transistor.

2. A display device according to claim 1, wherein the circuit A further includes:
a fifth transistor which has a second electrode thereof connected to a first electrode of the third transistor, and has a control electrode thereof connected to a first electrode of the first transistor; and
a sixth transistor which has a second electrode thereof connected to a first electrode of the fourth transistor, and has a control electrode thereof connected to a first electrode of the second transistor.

3. A display device according to claim 2, wherein the circuit B further includes:
a seventh transistor which receives inputting of the first AC signal fetched by the first transistor to a control electrode thereof, and outputs the first common voltage to a common electrode thereof corresponding to the first AC signal based on the first AC signal; and
an eighth transistor which receives inputting of the second AC signal fetched by the second transistor to a control electrode thereof, and outputs the second common voltage to a common electrode thereof corresponding to the second AC signal based on the second AC signal.

4. A display device according to claim 3, wherein the transfer clock includes first transfer clocks and second transfer clocks which differ in phase from the first transfer clocks, and wherein the circuit C further includes:
a first capacitive element;
a second capacitive element;
a circuit C1 which charges the first capacitive element for every first transfer clock, and boosts a voltage of a node thereof to which the control electrode of the seventh transistor is connected via the first capacitive element for every second transfer clock; and
a circuit C2 which charges the second capacitive element for every first transfer clock, and boosts a voltage of a node thereof to which the control electrode of the eighth transistor is connected via the second capacitive element for every said second transfer clock.

5. A display device according to claim 4, wherein the circuit C1 further includes:
a ninth transistor in diode connection which receives inputting of the first transfer clocks to a second electrode thereof;
a tenth transistor which has a second electrode thereof connected to a first electrode of the ninth transistor, and has a control electrode thereof connected to a control electrode of a seventh transistor;
an eleventh transistor in diode connection which has a second electrode thereof connected to a first electrode of the tenth transistor, and has a first electrode thereof connected to the control electrode of the seventh transistor; and
a twelfth transistor which receives inputting of the second transfer clocks to a second electrode thereof, and has a control electrode thereof connected to the control electrode of the seventh transistor, wherein
the first capacitive element is connected between a first electrode of the twelfth transistor and a first electrode of the tenth transistor, and
the circuit C2 further includes:

a thirteenth transistor in diode connection which receives inputting of the first transfer clocks to a second electrode thereof;
a fourteenth transistor which has a second electrode thereof connected to a first electrode of the thirteenth transistor, and has a control electrode thereof connected to a control electrode of an eighth transistor;
a fifteenth transistor in diode connection which has a second electrode thereof connected to a first electrode of the fourteenth transistor, and has a first electrode thereof connected to the control electrode of the eighth transistor; and
a sixteenth transistor which receives inputting of the second transfer clocks to a second electrode thereof, and has a control electrode thereof connected to the control electrode of the eighth transistor, wherein
the second capacitive element is connected between a first electrode of the sixteenth transistor and a first electrode of the fourteenth transistor.

6. A display device according to claim 5, wherein the circuit C further includes:
the sixteenth transistor which has the second electrode thereof connected to the control electrode of the eighth transistor, and has the control electrode thereof connected to the control electrode of the seventh transistor;
a seventeenth transistor which has a second electrode thereof connected to the first electrode of the sixteenth transistor, has a control electrode thereof connected to the control electrode of the seventh transistor, and receives inputting of a reference voltage to the first electrode thereof;
the eighteenth transistor which has a second electrode thereof connected to the control electrode of the seventh transistor, and has the control electrode thereof connected to the control electrode of the eighth transistor; and
a nineteenth transistor which has a second electrode thereof connected to a first electrode of the eighteenth transistor, has a control electrode thereof connected to the control electrode of the eighth transistor, and receives inputting of a reference voltage to the first electrode thereof.

7. A display device according to claim 1, wherein the first AC signal and the second AC signal are signals which make phases thereof different from each other for every 1 display line, and
each of said common electrode driver circuits outputs the first common voltage and the second common voltage alternately for every 1 display line to the respective common electrodes corresponding to the first AC signal and the second AC signal.

8. A display device according to claim 1, wherein a voltage level of the first AC signal and a voltage level of the second AC signal are not changed within 1 frame, and the voltage level of the first AC signal and a voltage level of the second AC signal are inverted within a next frame, and
the respective common electrode driver circuits alternately output the first common voltage and the second common voltage for every 1 frame to the respective common electrodes corresponding to the first AC signal and the second AC signal.

* * * * *